United States Patent
Brockerhoff et al.

(10) Patent No.: US 10,123,429 B2
(45) Date of Patent: Nov. 6, 2018

(54) MOUNTING OF COMPONENTS ON A PRINTED CIRCUIT BOARD

(71) Applicant: Infineon Technologies AG, Neubiberg (DE)

(72) Inventors: Philip Georg Brockerhoff, Munich (DE); Tilo Weide, Zorneding (DE)

(73) Assignee: Infineon Technologies Austria AG, Villach (AT)

( * ) Notice: Subject to any disclaimer, the term of this patent is extended or adjusted under 35 U.S.C. 154(b) by 61 days.

(21) Appl. No.: 15/215,412

(22) Filed: Jul. 20, 2016

(65) Prior Publication Data

US 2018/0027655 A1   Jan. 25, 2018

(51) Int. Cl.
| H05K 7/10 | (2006.01) |
| H05K 7/12 | (2006.01) |
| H05K 3/30 | (2006.01) |
| H05K 1/18 | (2006.01) |
| H05K 3/32 | (2006.01) |

(52) U.S. Cl.
CPC ............ *H05K 3/306* (2013.01); *H05K 1/182* (2013.01); *H05K 3/325* (2013.01); *H05K 2201/09709* (2013.01); *H05K 2201/1059* (2013.01); *H05K 2201/10545* (2013.01)

(58) Field of Classification Search
CPC ........ H05K 1/181; H05K 1/184; H05K 3/303; H05K 3/306
See application file for complete search history.

(56) References Cited

U.S. PATENT DOCUMENTS

| 5,007,844 A * | 4/1991 | Mason | H05K 3/301 439/68 |
| 5,606,298 A * | 2/1997 | Weiser | H01H 50/023 335/78 |
| 5,896,649 A * | 4/1999 | Millhimes | H01R 43/205 269/303 |
| 6,062,916 A * | 5/2000 | Gladd | H01R 9/223 439/751 |
| 6,124,772 A * | 9/2000 | Heise | B60R 16/0239 303/119.2 |
| 6,347,946 B1 * | 2/2002 | Trobough | G01R 1/0416 361/790 |
| 9,564,697 B2 * | 2/2017 | Eakins | H05K 3/3447 |
| 2007/0193774 A1 * | 8/2007 | Ito | H05K 1/111 174/260 |
| 2008/0296047 A1 * | 12/2008 | Kaji | H05K 1/0203 174/252 |
| 2011/0256749 A1 * | 10/2011 | Bayerer | H01R 12/585 439/345 |
| 2014/0262457 A1 * | 9/2014 | Katkar | H05K 1/09 174/257 |

* cited by examiner

*Primary Examiner* — Yuriy Semenenko
(74) *Attorney, Agent, or Firm* — Shumaker & Sieffert, P.A.

(57) ABSTRACT

A method for mounting components on a printed circuit board comprising the following steps: Arranging a first component on a first surface of the printed circuit board and a second component on a second surface of the printed circuit board, wherein the first component occupies a laterally overlapping position with the second component; and applying a first force to the first component for mounting it on the printed circuit board and/or applying a second force to the second component for mounting it on the printed circuit board. Further, a printed circuit board is suggested.

11 Claims, 7 Drawing Sheets

MOUNTING OF COMPONENTS ON A PRINTED CIRCUIT BOARD

BACKGROUND OF THE INVENTION

Embodiments of the present invention relate to a method for mounting components on a printed circuit board (PCB).

SUMMARY

An embodiment relates to a method for mounting components on a printed circuit board, the method comprising the following steps:
arranging a first component on a first surface of the printed circuit board and a second component on a second surface of the printed circuit board, wherein the first component occupies a laterally overlapping position with the second component; and
applying a first force to the first component for mounting it on the printed circuit board and/or applying a second force to the second component for mounting it on the printed circuit board.

An embodiment relates to a printed circuit board, comprising:
a first component arranged at a first surface of the printed circuit board;
a second component arranged at a second surface of the printed circuit board;
wherein the first component is in a laterally overlapping position with the second component; and
wherein the first component and the second component are press-connected to the printed circuit board.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

A printed circuit board (PCB) is used to mechanically mount (fasten) and/or electrically connect at least one component. The at least one component may comprise a electrical component, e.g., a capacitor, a resistor, an inductor, a light source (e.g., an LED, power LED) and/or an electrical connector. The at least one component may comprise an integrated circuit (IC), e.g., a microcontroller, an FPGA, a processor and/or a logic device. The at least one component may comprise a non-electrical component, e.g., a cooling body, a fan, a physical connector and/or a housing.

The at least one component may comprise a transistor, e.g., a high power transistor, a high frequency switch, an insulated-gate bipolar transistor (IGBT), a metaloxide-semiconductor field-effect transistor (MOSFET). The at least one component may comprise an energy storage element, e.g., a link voltage capacitance used in power supply units or electronic ballasts.

The PCB may be double sided so that components may be mounted on both sides or surfaces of the PCB. The PCB may be multi-layered so that components may be mounted on outer surfaces and/or on inner layers or surfaces of the PCB.

The components may be mounted by applying a through-hole technology (THT) or a through-hole-reflow technology (THR). Through-hole manufacture increases costs by requiring holes to be drilled accurately, and limits the available routing area for conductive traces and pads.

The components may be mounted by applying a surface mount technology (SMT). Thus, the component can be smaller-sized and a components placement on both sides or faces of the PCB is easily possible, allowing much smaller PCB assemblies with higher circuit densities. The component may be unsuitably large for SMT due to a power requirement or a mechanical limitation, or subject to mechanical stress which might damage the PCB. Such a component cannot be mounted with SMT.

All above mounting technologies require an additional soldering step to mechanically fasten and electrically interconnect the components on the PCB by a soldering material. Soldering bumps increase parasitic effects and are thus unwanted for specific applications, such as high-frequency and/or high-power applications.

The component may be mounted by applying a press-in technology (PIT). PIT mounting is intricately, since several mounting tools are required. PIT can only be applied to one surface of the PCB. This increases a required space on the PCB.

The PCB may allow the mounting of a plurality of components in a high component density. In this case, at least one conductive track (trace), pad and/or other conducting feature is used as an interconnection means to interconnect each component and to interconnect the PCB with other entities, e.g., a power supply, a sensor means, a measuring unit, another PCB, and so on. Each trace may consist of a flat, narrow strip of a conductive material (copper). A parasitic resistance, determined by a width and a thickness of the trace, may limit a current to be carried. In radio-frequency (RF) and fast switching circuits, a parasitic inductance and/or a parasitic capacitance of the trace becomes a significant (mostly unwanted) circuit element and may limit the switching frequency operable on the PCB. The parasitic inductance and/or the parasitic capacitance may lead to unwanted over-voltages (over-current) and voltage ripples (current ripples) during switching.

It is a desire to reduce these parasitic effects. Thus, unwanted electrical (parasitic) effects, e.g., unwanted overvoltages caused by switched voltages and/or unwanted generation of heat shall be reduced. As a result, components on the PCB with reduced parasitic effects may operate at higher frequencies, e.g., faster switches based on SiC or GaN may be applicable and/or higher loads can be operated, e.g., in high power applications.

This may be achieved by miniaturizing components and/or by reducing connection means' lengths/widths and/or by reducing unutilized areas on the PCB.

Figure 1:
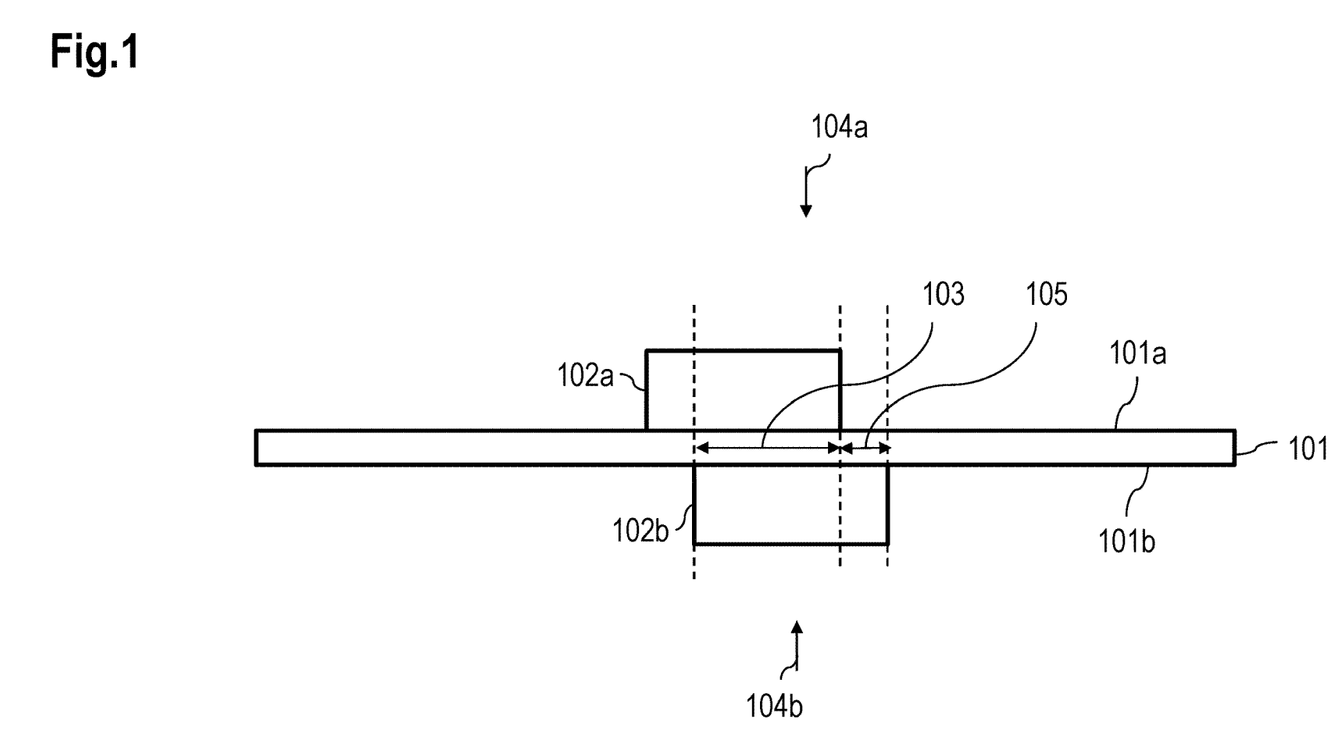
FIG. 1 shows an exemplary schematic cross-sectional side view of a printed circuit board comprising a mounted component on each surface.

FIG. 1 shows a schematic cross-sectional side view of a PCB 101. The PCB 101 comprises a first face or surface 101a and a second face or surface 101b which are facing into opposite directions. A component 102a is arranged on the first surface 101a. A component 102b is arranged on the second surface 101b. The component 102a occupies a laterally overlapping position with the component 102b. The overlap shown is partial. Therefore, in a top-down view on one of the surfaces 101a or 101b, the two components 102a and 102b overlap.

Thus, the PCB 101 comprises a region 103 in which the PCB 101 or faces the component 102a arranged on the first surface 101a and the component 102b arranged on the second surface 101b. Therefore, the components 102a, 102b on either surface 101a, 101b partly overlap (subtend) in a region 103, separated by the PCB 101.

The component 102a may be laterally displaced from the component 102b by a displacement offset 105. The displacement offset 105 decreases manufacturing costs and avoids short circuits and leakage currents.

A respective force 104a, 104b is applied using the press-in technique (PIT) to each of the components 102a, 102b to press them onto the first surface 101a and the second surface 101b, respectively, for mounting them on the PCB 101. The force 104a, 104b may lead to at least non-positively locking (i.e., to non-positively locking or a combination of a non-positively locking and positively locking) the components 102a, 102b to the PCB 101. Thus, the PIT provides at least a press-connection.

The forces 104a and 104b may be applied simultaneously to each component 102a, 102b.

This PIT approach may lead to a higher component density which may reduce the overall size of the PCB 101 since both sides are now mounted with components 102a, 102b by using PIT. Thus, traces on the PCB 101 may be reduced (e.g. shortened, avoided etc.) which may lead to a reduction of parasitic effects.

So, a static power dissipation may be reduced caused by a reduced parasitic ohmic resistance value. A higher current may be used on the PCB 101.

Also, a dynamic power dissipation may be reduced caused by a reduced parasitic inductance (and/or capacitance) value. Thus, a higher switching frequency may be applied on the PCB 101 and/or switches with a lower dielectric strength may be used.

Figure 2A:
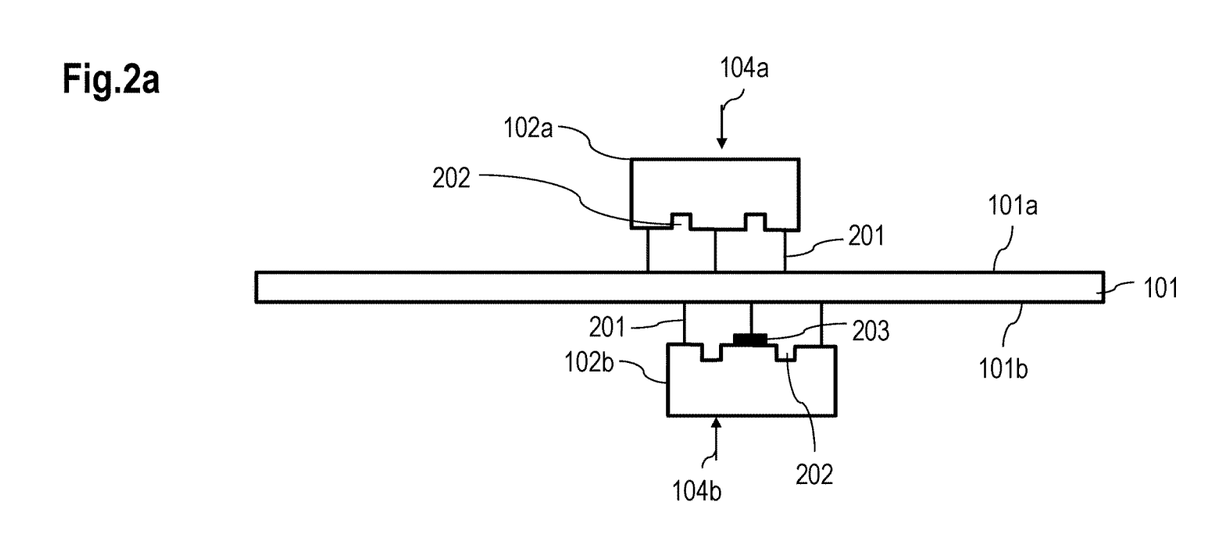
FIG. 2a shows an exemplary schematic cross-sectional side view of a printed circuit board before applying forces to the first component and the second component.

FIG. 2a shows a cross-sectional side-view of the PCB 101 according to FIG. 1 before the forces 104a and 104b have been applied to the component 102a and the component 102b.

The component 102a comprises three metal pins 201 that are arranged on the bottom side of the component 102a facing the first surface 101a. The pins 201 are used to mechanically fasten and/or electrically connect the component 102a to the PCB 101. Optionally, the component 102a further comprises two recesses 202. Each recess 202 may be arranged between two neighboring pins 201.

The component 102b comprises three metal pins 201 that are arranged on the bottom side of the component 102b facing the second surface 101b. The pins 201 are used to mechanically fasten and/or electrically connect the component 102b to the PCB 101. Optionally, the component 102b further comprises a spacer 203 on its bottom side. Optionally, the component 102b further comprises two recesses 202. Each recess 202 may be arranged between two neighboring pins 201.

After positioning the component 102a and the component 102b, the forces 104a and 104b are applied to the component 102a and the component 102b, respectively to press the components 102a, 102b towards the PCB 101 for mounting the components 102a, 102b on the PCB 101. The forces 104a and 104b may be applied simultaneously.

Figure 2B:
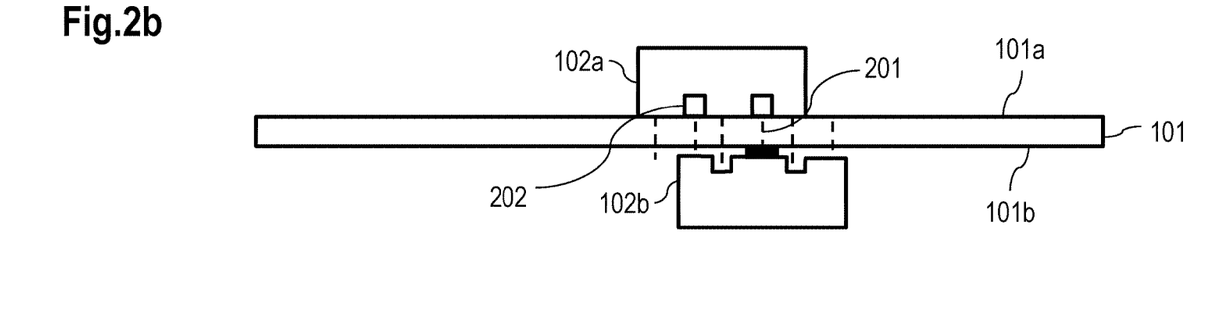
FIG. 2b shows the exemplary schematic cross-sectional side view according to FIG. 2a after having applied the forces to the first component and the second component.

FIG. 2b shows a cross-sectional side-view of the PCB 101 according to FIG. 2a after the forces 104a, 104b have been applied to the component 102a and/or the component 102b.

The pins 201 of both, the component 102a and the component 102b, have been pressed into the PCB 101 and are at least non-positively locked with the PCB 101. To this effect, metallized through holes (not shown) are present in the PCB 101 for introduction of the pins 201. By pressing the pins 201 into the through holes, the component 102a and the component 102b are each fixedly connected to the PCB 101.

The bottom side of the component 102a lies on the first surface 101a of the PCB 101. To assure that the pins 201 of the component 102a do not interfere with the component 102b, the recesses 202 of the component 102b are localized at positions where the pins 201 of the component 102a may stick out or protrude from the second surface 101b. Thus, these pins 201 of the component 102a may be inserted loosely into the recesses 202 of the component 102b without exerting any significant force on the component 102b. Therefore, space can be saved, and a reliable placement of the component 102a and the component 102b may be achieved even if the component 102a is pressed onto the PCB 101 with the component 102b positioned in an overlapping manner on the second surface 101.

The bottom side of the component 102b facing the second surface 101b is positioned at a distance to the second surface 101b of the PCB 101. The distance may be defined by a height of the spacer 203. The spacer 203 may be used to increase a heat exchange between the component 102b and an ambient air. The spacer 203 may be used to assure that the pins 201 of the component 102b do not stick out or protrude from the first surface 101a. Using the spacer 203 may lead to arranging the components 102a, 102b in standardized dimension irrespective of a thickness of the PCB 101.

The connection or mounting of the component 102a and the component 102b may alternatively or additionally be achieved with bolts, pass springs or sliding spring that may be arranged at the components 102a, 102b. Respective counterparts of the bolts, pass spring or sliding spring may be arranged at the PCB 101.

The pins 201 of the component 102a are placed in sufficient lateral distance (i.e., parallel to a plane of the PCB 101) to the pins 201 of the component 102b. It may be required to displace one of the components 102a, 102b by the displacement offset 105. Therefore, standardized components 102a, 102b can be used without rearranging the pins 201.

The pins 201 may be longer than a thickness of the PCB 101 to ensure proper mounting.

Figure 3:
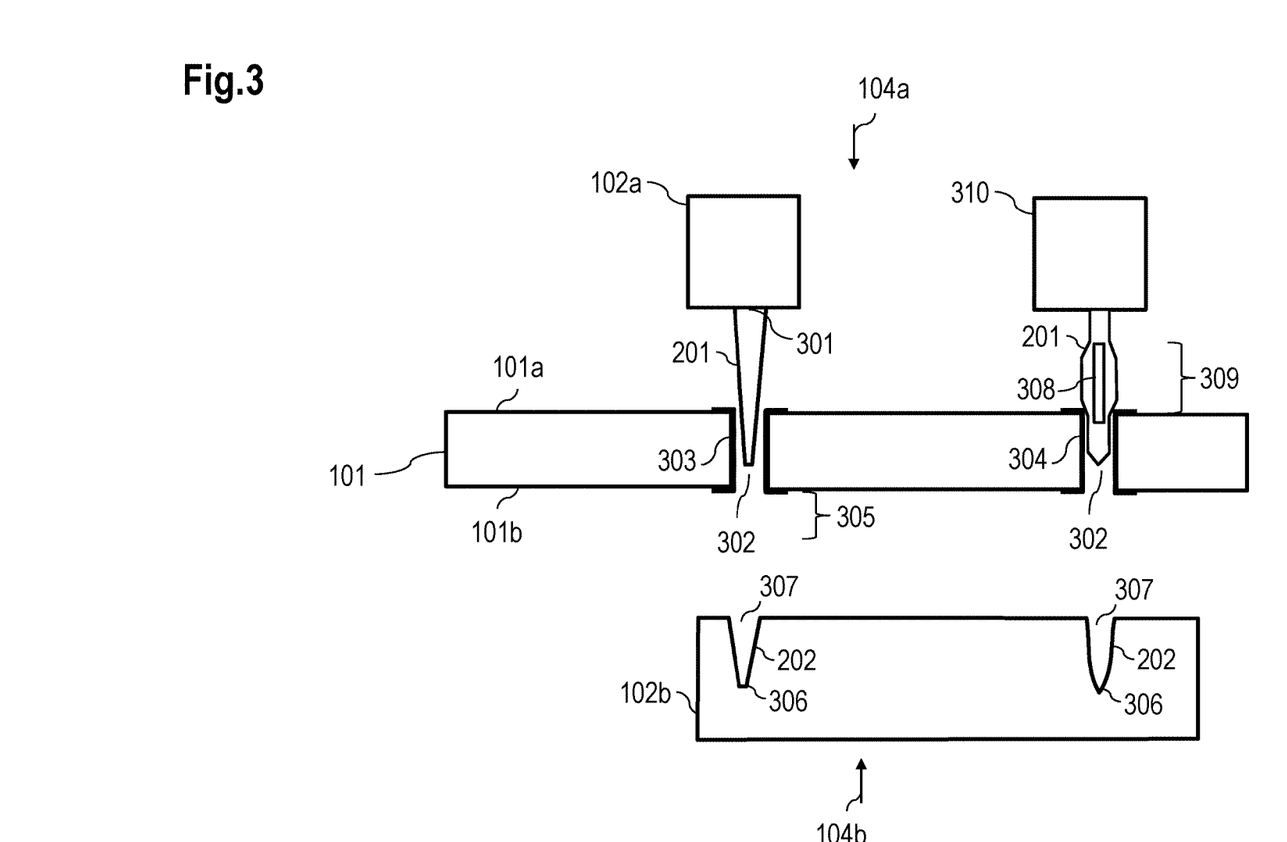
FIG. 3 shows an exemplary cross-sectional side view diagram illustrating fastening components to the printed circuit board.

FIG. 3 shows an exemplary schematic diagram to illustrate fastening the component 102a and a component 310 to the PCB 101.

The component 102a and the component 102b are arranged at the first surface 101a and the second surface 101b of the PCB 101, respectively. The component 102a at least partly overlaps the component 102b in a lateral manner.

The component 102a comprises the pin 201 having a near end 301 at the bottom side of the component 102a. The pin 201 has a tip or distal end 302 that is arranged distant from the component 102a. The pin 201 is cone-shaped. Thus, the distal end 302 is slimmer (regarding, e.g., diameter, width) than the near end 301. The pin 201 is used to mechanically fasten and/or electrically connect the component 102a to the PCB 101.

The PCB 101 comprises through-holes 303 and 304. The through-hole 303 may comprise a metallic bushing that is electrically connected to an electrical interconnect structure (not shown). The diameter of the through-hole 303 is greater than the dimension (in particular width) of the distal end 302 of the pin 201 but smaller than the dimension (in particular width) of the near end 301.

To mount the component 102a to the PCB 101, the pin 201 may be placed into the through-hole 303. When the PIT is used to apply the force 104a to the component 102a, the pin 201 is brought into a non-positive locking connection with the through-hole 303 and thus provides a mechanical connection between the component 102a and the PCB 101, e.g., by elastically and/or plastically deforming the pin 201 and/or the through-hole 303.

After having applied the force 104a, the pin 201 may protrude from the second surface 101b of the PCB 101. Thus, the distal end 302 of the pin 201 may have a distance 305 to the second surface 101b of the PCB 101.

The component 102b is arranged at the second surface 101b of the PCB 101 and faces the component 102a. The component 102b comprises a recess 202 that may be cone-shaped. Thus, an opening 307 of the recess 202 at the surface of the component 102b is greater than an inner dimension 306 of the recess 202. The recess 202 is used to accommodate the protruding section of the pin 201 of the component 102a, in particular its distal end 302. The depth of the recess 202 may be greater than the distance 305, i.e., the length of the protruding section.

Further in FIG. 3, the component 310 is arranged at the first surface 101a of the PCB 101. The component 310 also at least partly overlaps with the component 102b in a lateral manner.

The component 310 comprises a pin 201 having an expansion 309 (deformation zone) that is arranged around the middle of the pin 201. The pin 201 comprises an elongated hole 308 that extends from a distal end to a near end of the pin 201. The length of the elongated hole 308 may correspond to a length of the expansion 309. The pin 201 is used to mechanically fasten and/or electrically connect the component 102a to the PCB 101 in a non-positive locking manner using a spring effect.

A through-hole 304 may have a metallic bushing that may be electrically connected via conductive traces of an electric interconnection structure. The diameter of the through-hole 304 may be greater than a lateral dimension (e.g., a width) of the pin 201 at a non-extended area but smaller than the dimension of the pin 201 at the expansion 309.

To mount the component 310 on the PCB 101, the pin 201 is pressed or inserted into the through-hole 304. When the force 104a is applied to the component 310, the pin 201 is non-positively locked in the through-hole 304. A mechanical connection between the component 310 and the PCB 101 may be provided by an elastic compression (deformation) of the expansion 309 when pushed inside the through-hole 304, thus providing a spring effect. The compression of the expansion 309 is adjustable by a length and a diameter of the elongated hole 308 and the expansion area 309 of the pin 201.

After having applied the force 104a, the pin 201 of the component 310 may stick out from the second surface 101b of the PCB 101. The component 102b is arranged on the second surface 101b of the PCB 101 and faces the component 310. The component 102b comprises another cone-shaped recess 202. Thus, a diameter of an opening 307 of the recess 202 at the surface of the component 102b that faces the second surface 101b of the PCB 101 is greater than an inner diameter 306 of the recess 202. The recess 202 is used to accommodate the protruding section of the pin 201 of the component 102a, in particular its distal end 302. A depth of the recess 202 may be greater than the distance 305, i.e., a length of the protruding section.

Figure 4:
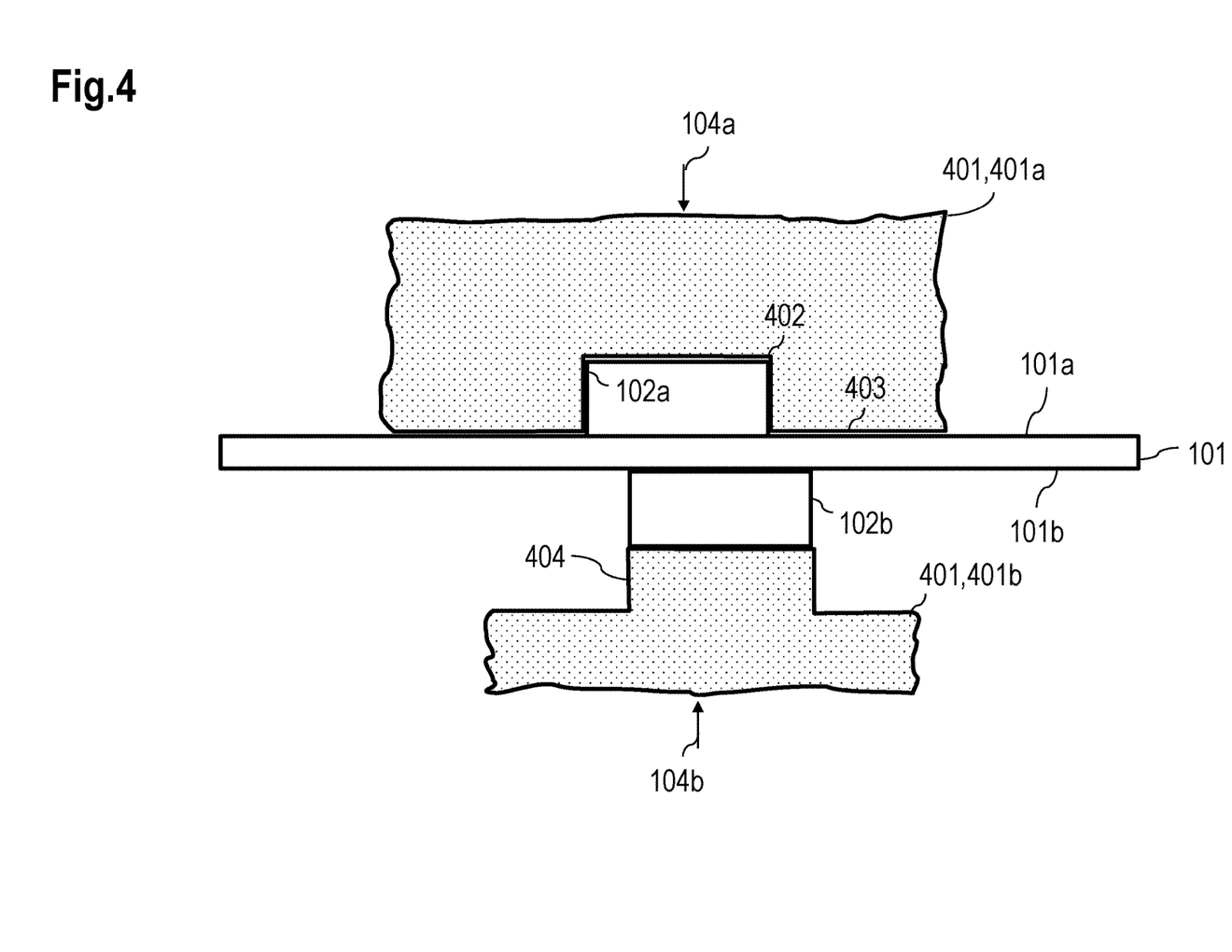
FIG. 4 shows an exemplary schematic cross-sectional side view of the printed circuit board and a tool after having applied the force to simultaneously mount the components according to FIG. 1 or FIG. 2b.

FIG. 4 shows a cross-sectional side view of a tool 401 for applying the forces 104a, 104b to mount the components 102a, 102b, in particular in a simultaneous manner. In FIG. 4, the tool 401 is shown in a position after having applied the forces 104a, 104b.

The tool 401 is used to apply the forces 104a, 104b to the components 102a, 102b in the framework of a PIT process. The tool 401 comprises a first tool-part 401a that applies the force 104a to the component 102a and a second tool-part 401b that applies the force 104b to the component 102b. The tool 401 provides the forces 104a, 104b by a vertical movement of the first tool-part 401a towards the first surface 101a of the PCB 101 and (e.g., simultaneously) by a vertical movement of the second tool-part 401b towards the second surface 101b of the PCB 101. These applied forces 104a, 104b lead to a mechanical mounting of the components 102a, 102b in an at least non-positive locking manner as described above. In particular, the components 102a, 102b (i.e., their pins) are pressed into (e.g., using the PIT) the PCB 101.

The first tool-part 401a exemplarily comprises a recess 402. The recess 402 may be formed correspondingly to accommodate the component 102a. This recess 402 enables the tool 401 to properly provide the force 104a with the correct amount to the component 102a. The vertical movement of the first tool-part 401a may be stopped as soon as a contact area 403 of the first tool-part 401a contacts the first surface 101a of the PCB 101.

The second tool-part 401b exemplarily comprises a punch-block 404. The punch-block 404 may have a surface that corresponds to the surface of the component 102b. This punch block 404 may allow arranging a further component (not shown in FIG. 4) in near vicinity to the component 102b. This further component may have a greater dimension (height) than the component 102b.

The vertical movement of the tool 401 may be stopped based on a pressure (force) measurement to ensure that the components 102a, 102b are not damaged by the forces 104a, 104b.

Figure 5:
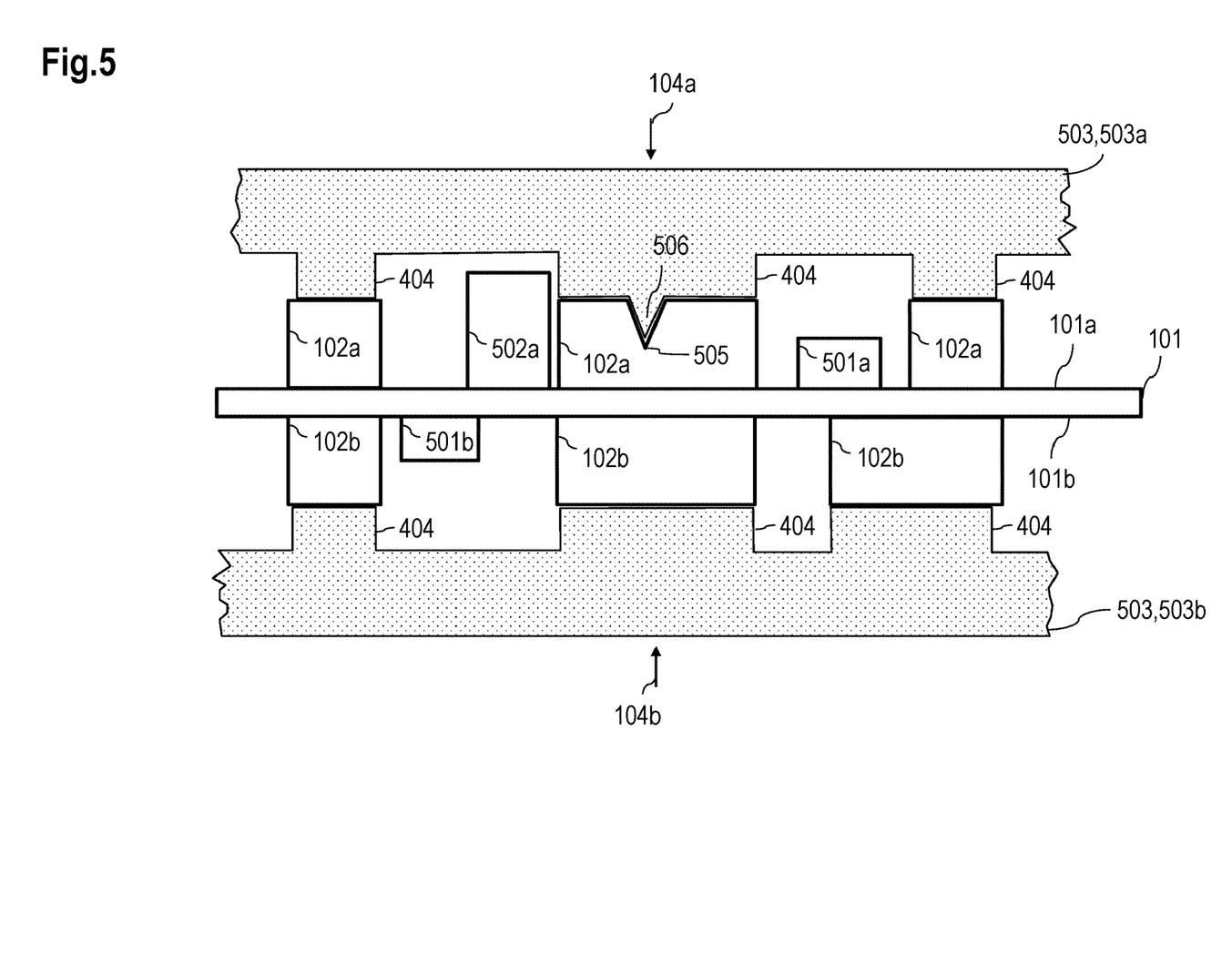
FIG. 5 shows an exemplary schematic cross-sectional side view of another tool after having applied a force to simultaneously mount another set of components.

FIG. 5 shows a cross-sectional side view of using a tool 503 to apply the forces 104a and 104b to mount the components 102a, 102b.

The PCB 101 comprises the first surface 101a and the second surface 101b. The first surface 101a of the PCB 101 is opposite to the second surface 101b of the PCB 101. Three components 102a are mounted on the first surface 101a. The components 102a may differ in height.

Additionally, a component 501*a* is mounted on the first surface 101*a* of the PCB 101. The component 501*a* is smaller than the components 102*a*. The component 501*a* may have been mounted by a technology other than the PIT, e.g., by SMT. The component 501*a* may have been mounted prior to mounting the components 102*a*.

Additionally, the first surface 101*a* of the PCB 101 comprises yet another component 502*a*. The component 502*a* is higher than the components 102*a*. The component 502*a* may have been mounted by a technology other than the PIT, e.g., in THT or THR. The component 502*a* may be mounted after having mounted the components 102*a*.

Three components 102*b* are mounted on the second surface 101*b* of the PCB 101. The components 102*b* may differ in height. The components 102*b* are in a laterally overlapping arrangement with the components 102*a*, i.e. partially or fully overlapping.

Additionally, the second surface 101*b* of the PCB 101 comprises a component 501*b*. The component 501*b* is smaller than the components 102*b*. The component 501*b* can be mounted using a technology other than the PIT, e.g., by THT. The component 501*b* may have been mounted prior to the components 102*b*.

A tool 503 is used to apply forces 104*a*, 104*b* to the components 102*a*, 102*b* using an PIT technique. The tool 503 comprises a first tool-part 503*a* that applies the force 104*a* to the components 102*a*. The tool 503 comprises a second tool-part 503*b* that applies the force 104*b* to the components 102*b*. The tool 503 provides the forces 104*a*, 104*b* to the components 102*a* and the components 102*b*, respectively, by a vertical movement of the first tool-part 503*a* towards the first surface 101*a* of the PCB 101 and (e.g., simultaneously) by a vertical movement of the second tool-part 503*b* towards the second surface 101*b* of the PCB 101. This forces 104*a*, 104*b* lead to a mechanical mounting of the components 102*a*, 102*b* in an at least non-positive locking manner.

The first tool-part 503*a* exemplarily comprises three punch-blocks 404. The punch-blocks 404 may have a surface that corresponds to the surface of the components 102*a* to apply a substantially constant force to the components 102*a*. The punch blocks 404 allow arranging the further components 501*a*, 502*a* in near vicinity to the components 102*a*.

The first tool-part 503*a* exemplarily comprises an alignment pin 506. The alignment pin 506 may be used to align the first tool-part 503*a* with the PCB 101 or a component 102*a* arranged thereon by inserting the alignment pin 506 into a recess 505 of the component 102*a*. The alignment pin 506 may be cone-shaped.

The alignment pin 506 may define the vertical movement and/or the exact position of the tool-part 503*a*.

The alignment pin 506 may comprise a spring (not shown).

The vertical movement of the tool 503 may be stopped based on a pressure measurement, e.g., achieved at the alignment pin 506, to ensure that the components are not destroyed by application of the forces 104*a*, 104*b*.

The second tool-part 503*b* exemplarily comprises three punch-blocks 404. The punch-blocks 404 may have surfaces that correspond to the surfaces of the components 102*b* to apply a constant force to all components 102*b*. The punch blocks 404 may allow arranging the further component 501*b* in near vicinity to the components 102*b*.

It is an option that the punch blocks 404 reach down to the surfaces 101*a*, 101*b* of the PCB 101. Also, a pin can be provided that extends into a recess of the PCB.

Figure 6:
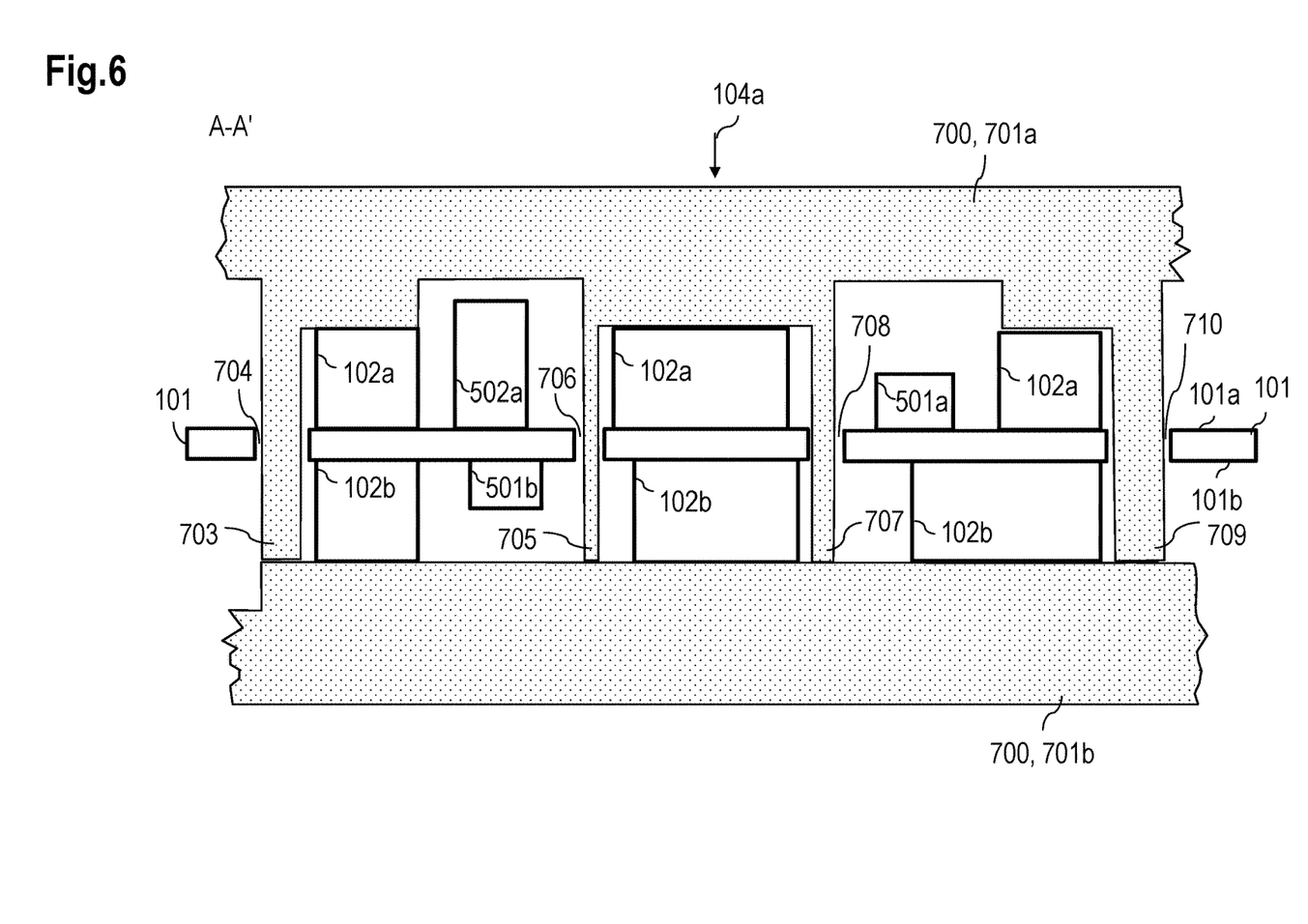
FIG. 6 shows an exemplary schematic cross-sectional side view of a tool after having applied force to simultaneously mount even another set of components.
Figure 7:
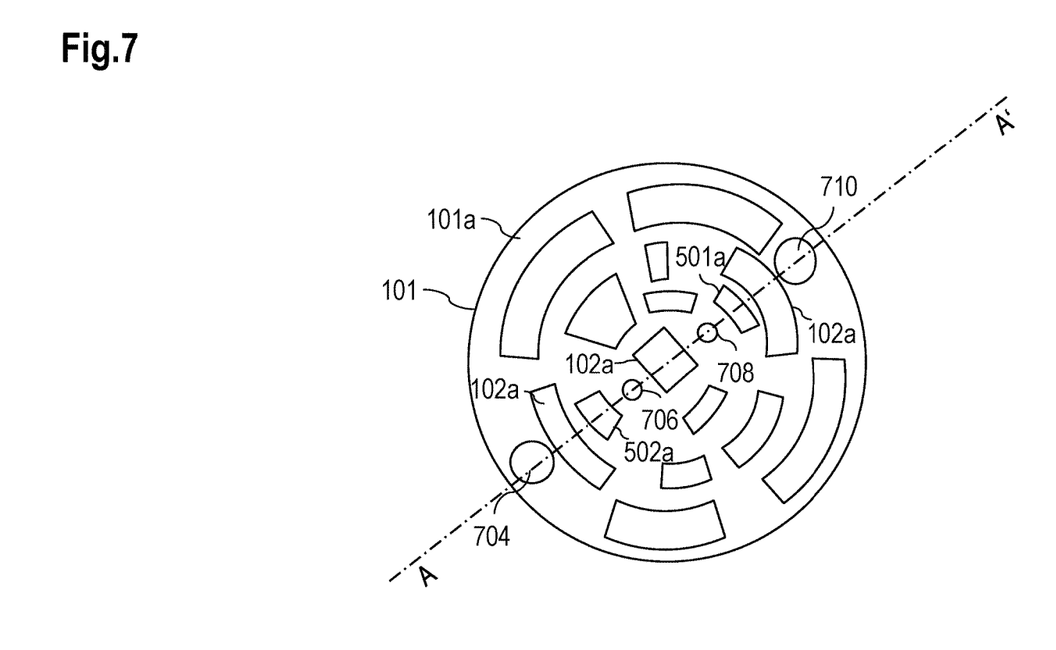
FIG. 7 shows an exemplary schematic top-view on a first surface of the printed circuit board of FIG. 6.

FIG. 6 shows a cross-sectional side view of a tool 701 after having applied a force 104*a* to mount the components 102*a*, 102*b*. FIG. 7 corresponds to a cross-sectional side view onto a plane A-A' as represented by an intersection line A-A' shown in FIG. 7. The schematic diagram comprises the PCB 101, the components 102*a*, the components 102*b*, the components 501*a*, 501*b*, 502*a* as described in accordance with FIG. 5.

The tool 701 comprises a first tool-part 701*a* that directly applies the force 104*a* to the components 102*a*. The tool 701 comprises a second tool-part 701*b* that differs from the second tool-parts described above in that it does not vertically move. Rather, the second tool-part 701*b* functions as a counterpart to the first tool-part 701*a* and withstands the directly applied force 104*a* of the first tool-part 701*a*. It therefore exerts a counterforce onto the components 102*b*. Thus, the tool 701 provides the force 104*a* directly to the components 102*a* and indirectly to the components 102*b* by a vertical movement only of the first tool-part 701*a*. This applied force 104*a* leads to a mechanical mounting of the components 102*a*, 102*b* in an at least non-positive locking manner as described above.

The PCB 101 comprises four through-holes 704, 706, 708, 710 to enable (guide) a vertical movement of movement limiters 703, 705, 707, 709 of the first tool-part 701*a* through the PCB 101. As soon as the movement limiters 703, 705, 707, 709 of the first tool-part 701*a* contact the second tool-part 701*b*, the movement of the first tool-part 701*a* is stopped.

FIG. 7 shows a top-view of the first surface 101*a* of the PCB 101 of FIG. 6.

The PCB 101 is built in circular shape. The components 102*a* are arranged in circular rings around a midpoint. The circular rings may be equidistant. The outer through-holes 704 and 710 comprises greater diameters than the inner through-holes 706, 708.

The components 102*a* and the components 102*b* may comprise components of a same type, e.g., a capacitor or a transistor.

Alternatively, the components 102*a* and the components 102*b* may be components of different types and/or comprise different dimensions, such as height, length and/or width. The components 102*a* may comprise a power transistor module and the components 102*b* may comprise a capacitor for an electronic ballast or power supply unit.

The components 102*a* and 102*b* may be products comprising standardized packages and/or housings. An adapted layout or additional spacers may be used to mount the components 102*a* and 102*b* to the PCB.

The force 104*a* may be applied to the components 102*a* and/or 102*b* simultaneously. The tool-parts 701*a* and 701*b* may be aligned so that the first tool-part 701*a* is directly above the second tool-part 701*b*.

The PCB 101 is placed between the first tool-part 701*a* and the second tool-part 701*b*.

The components 102*a* and 102*b* may be arranged on the PCB 101 prior being placed between the first tool-part 701*a* and the second tool-part 701*b*.

The tool 701 moves vertically to mount the components 102*a* and 102*b* to the PCB 101. The movement is stopped caused by movement limiters 703, 705, 707, 709 or pressure measurement or surface contacting.

The examples suggested herein may in particular be based on at least one of the following solutions. In particular combinations of the following features could be utilized in order to reach a desired result. The features of the method could be combined with any feature(s) of the device, apparatus or system or vice versa.

A method is provided for mounting components on a printed circuit board, the method comprising the following steps:
- arranging a first component on a first surface of the printed circuit board and a second component on a second surface of the printed circuit board, wherein the first component occupies a laterally overlapping position with the second component; and
- applying a first force to the first component for mounting it on the printed circuit board and/or applying a second force to the second component for mounting it on the printed circuit board.

The printed circuit board (PCB) may comprise an electrical interconnection structure to electrically connect the first component and/or the second component, e.g., with each other or with other components, e.g., using conductive traces (tracks), through-holes, pads and the like. The PCB may comprise a first electrical interconnection structure on the first surface and/or a second electrical interconnection structure on the second surface. The first electrical interconnection structure and the second electrical interconnection structure may be electrically connected.

The force applied to a respective component causes this component to be moved towards the PCB. The force may be applied in a vertical direction to provide a vertical movement of the component in case the PCB is oriented horizontally. The first and/or the second force may be directly applied to the respective component, e.g. by pressing a punch onto this component. The first and/or the second force may also be "indirectly" applied to the respective component, e.g., in form of a counter-force opposing a pressure. Such an indirect application of force may be achieved, e.g., by pressing the PCB against a stationary base with the component positioned between the PCB and the base. In this case, the force may be directly applied to the PCB while the counter-force exerted by the base onto the component presses the component towards the PCB for mounting.

The first and second forces may be applied for simultaneously mounting the first and second component. This may, e.g., be the case when the first force is directly applied on the first component and creates a second (counter-) force acting on the second component. This may also be the case when the first force and the second force are both directly applied at the same time.

Alternatively, the first force and the second force may be applied a different times. In one example, the first component may be pressed towards the first surface of the PCB by applying the first force, the PCB is then turned around, and the second component is then pressed or moved towards the second surface of the PCB by applying the second force. This has the advantage that the same force applying means (e.g., a tool like a press etc.) may be used to mount the first component and the second component. In this example—but also generally—the first force may be equal or different in strength etc. from the second force.

By using a force for mounting a respective component on the PCB, this component is secured or fixed to the PCB for mechanical and—if applicable—for electrical connection with an electrical interconnection structure. The mounting may generally comprise a positive lock connection and/or a non-positive lock connection of the component and the PCB. The positive lock connection may also be called a form-fit connection. The non-positive lock connection may also be called an interference fit, a press fit or a friction fit. Such a connection may also be called a "press-connection", and the protruding part and the PCB may be called to be "press-connected". Such a connection achieved by pressing the component onto the PCB may also be called a "press-connection".

A component may have one or more protruding parts that can be pressed into respective recesses of the PCB.

A tool may be used to apply a force to the component to press its protruding part(s) in a respective recess of the PCB.

The connection between the first and/or second component and the PCB may be solder-free and/or glue-free. This gives the advantage of a cost-effective and simple to implement connection technique. Also, chemical reactions are avoided, and no thermal stresses are induced.

The component may be any component suitable to be mounted on a PCB, e.g., an electrical component or a non-electrical component. The component may be a resistor, a capacitor, an inductor, a semiconductor device like a transistor, a diode, an integrated circuit, etc.

Regarding the overlapping positions of the first and second components, the overlap may be a partial overlap (e.g., the first and the second component both have non-overlapping regions) or a total overlap (e.g. only the first component or the second component or none of the components has an non-overlapping region). In particular, the overlap is a lateral overlap, e.g. an overlap with respect to an in-plane direction of the PCB or along the first surface and the second surface of the PCB. Thus, if viewed in a top-down manner onto the first surface or the second surface and ignoring the PCB, the first component at least partly faces the second component. In other words, the first component is separated from the second component by the PCB and the first component at least partly extends under (subtends) the second component.

Thus, there is at least one region of the PCB which is covered, at its first surface, by the first component and which is covered, at its second surface, by the second component. This reduces required space and reduces parasitic effects. Consequently, the PCB can be operated with higher switching frequencies and/or higher load currents.

Generally, a first component and/or a second component may have one or more overlapping second components and/or first components, respectively. Also, one or more groups (e.g., pairs) of overlapping components may be mounted to the PCB.

In an embodiment, the first component and/or the second component are mounted on the PCB using a press-in technique.

The press-in technique is a solder-free mounting technique to mechanically fasten and—if applicable—electrically connect components on a PCB. Using the press-in technique e, a protruding part of a component (e.g., a metal pin) is pressed into a metallized recess (e.g., a through-hole being surrounded by a metal tube or bushing) of the PCB to achieve a locking connection with the PCB. The connection achieved by using the press-in technique may comprise an at least non-positive locking connection, i.e. a non-positive locking connection or a combination of a non-positive locking connection and a positive locking connection.

The locking connection may be achieved by elastically and/or plastically deforming the protruding part and/or the recess, e.g. the pin and/or the bushing. For an electrical connection, the metal of the recess is connected to an electrical interconnection structure.

The protruding part and/or the through-hole may be pretreated, e.g., by roughening a surface and/or by applying an electrically conductive filler material.

The mounting of the component(s) to the PCB may in particular be performed using the "press-in technique" as described, e.g., in IEC 60352-5 and/or in ERNI Systemtechnik: Bestückungen elektronischer Baugruppen, ch. "Einpresstechnik".

It is an embodiment of the press-in technology that the first component and/or the second component comprises a cone-shaped pin and/or a pin comprising an expansion and an elongated hole; and that the printed circuit board comprises a through-hole for inserting and holding the pin in an at least non-positive manner when applying the force to the first component and/or the second component. These forms of the pin may lead to a particularly reliable press-connection between the respective component and the PCB.

In an embodiment, the first component and/or the second component comprises a recess in its bottom surface facing the first surface and second surface, respectively, of the printed circuit board and wherein a pin of the overlapping second component and/or first component, respectively, is pressed through a through-hole of the PCB such that is inserted into the recess.

The recess or cavity may therefore be used for accommodating a pin of an overlapping second component and first component, respectively, (i.e., a component mounted on the other side or surface of the PCB in an overlapping manner) that may protrude or stick out from the first and second surface, respectively. This avoids a displacement or blockage of overlapping components during a mounting process. The pin may be inserted into the recess in a loose or sliding manner. It is an embodiment that a tip of the pin does touch the component.

Alternatively or additionally, a recess may be an alignment recess to exactly mount the respective component to the printed circuit board.

In an embodiment, the first component and/or the second component comprises a spacer at its bottom surface facing the respective surface of the printed circuit board.

The spacer or distance element increases a distance between the bottom surface or side of the component and the respective (neighboring) surface of the PCB. This gives the advantage that a cooling of this components may be enhanced. The spacer also enables avoiding that a protruding part of this component sticks out from the other surface of the PCB which, in turn, may also avoid a displacement or blockage of overlapping components.

In an embodiment, a section of a pin of the first component and/or the second component which sticks out from the second surface and/or the first surface of the printed circuit board, respectively, is further processed.

The further processing may include trimming this section and/or bending this section. This may facilitate mounting of overlapping components and/or may enhance a robustness and reliability of the connection between this component and the PCB.

In an embodiment, an alignment pin is used to align the printed circuit board and/or at least one of the components.

The alignment pin may be a part of a tool that applies the force to the first component and/or the second component. This embodiment achieves a particularly precise positioning of the at least one component and/or the PCB.

Alternatively or additionally, the alignment pin may be a part of the component and/or the printed circuit board.

It is an embodiment that the application of the force and/or of a movement based on the force is stopped pursuant to:
performing a force measurement;
using a movement limiter;
reaching a contact of the first surface with the printed circuit board; and/or
reaching a contact of the second surface with the printed circuit board.

The force measurement (e.g., a pressure measurement) may be performed by measuring the force and/or movement between a tool for pressing the first component and/or the second component and this first component and/or second component. This force measurement may be used together with the movement limiter. The force measurement may measure and act upon an increase in the counter-force exerted on the tool because of the movement limiter reaching an end stop (e.g., the PCB).

It is another embodiment that the printed circuit board comprises through-holes to guide a movement limiter during force application.

In an embodiment, a further component is mounted on the printed circuit board by using one or more of the following techniques:
a surface mount technology;
a through hole reflow technology; or
a through hole technology.

This allows a particularly flexible mounting of components on the PCB.

In an embodiment, a tool is used to apply the first force and/or the second force, wherein the tool comprises a first part to apply the first force to the first component and/or a second part to apply the second force to the second component.

It is an embodiment that the tool applies the force by vertically moving the first part towards the first surface of the printed circuit board and/or by vertically moving the second part towards the second surface of the printed circuit. Alternatively, the first part or the second part are non-moving or stationary parts. The PCB may be placed in one part, e.g., the non-moving part.

A printed circuit board may have been mounted using the above described method.

A printed circuit board is suggested comprising:
a first component arranged at a first surface of the printed circuit board;
a second component arranged at a second surface of the printed circuit board;
wherein the first component is in a laterally overlapping position with the second component; and
wherein the first component and the second component are press-connected to the printed circuit board.

In an embodiment, the first component and the second component have been press-connected to the PCB using a press-in technique.

In an embodiment, the first component and/or the second component comprise a recess in its bottom surface into which a protruding part of the overlapping second component and/or the first component, respectively, is inserted.

The following examples demonstrate one or more aspects of this disclosure and these examples may be combined in any way:

EXAMPLE 1

A method for mounting components on a printed circuit board, the method comprising the following steps:
arranging a first component on a first surface of the printed circuit board and a second component on a second surface of the printed circuit board, wherein the first component occupies a laterally overlapping position with the second component; and applying a first force to the first component for mounting it on the printed circuit board and/or applying a second force to the second component for mounting it on the printed circuit board.

EXAMPLE 2

The method according to example 1, wherein the first component and/or the second component are mounted on the PCB using a press-in technique.

EXAMPLE 3

The method according to any combination of examples 1 and 2, wherein the first component and/or the second component comprises a recess in its bottom surface facing the first surface and second surface, respectively, of the printed circuit board and wherein a pin of the overlapping second component and/or first component, respectively, is pressed through a through-hole of the PCB such that is inserted into the recess.

EXAMPLE 4

The method according to any combination of examples 1-3, wherein the first component and/or the second component comprises a spacer at its bottom surface facing the respective surface of the printed circuit board.

EXAMPLE 5

The method according to any combination of examples 1-4, wherein a section of a pin of the first component and/or the second component which sticks out from the second surface and/or the first surface of the printed circuit board, respectively, is further processed.

EXAMPLE 6

The method according any combination of examples 1-5, wherein an alignment pin is used to align the printed circuit board and/or at least one of the components.

EXAMPLE 7

The method according any combination of examples 1-6, wherein a further component is mounted on the printed circuit board by using one or more of the following techniques:
a surface mount technology;
a through hole reflow technology; or
a through hole technology.

EXAMPLE 8

The method according any combination of examples 1-7, wherein a tool is used to apply the first force and/or the second force, wherein the tool comprises a first part to apply the first force to the first component and/or a second part to apply the second force to the second component.

EXAMPLE 9

A printed circuit board, comprising:
a first component arranged at a first surface of the printed circuit board;
a second component arranged at a second surface of the printed circuit board;
wherein the first component is in a laterally overlapping position with the second component; and
wherein the first component and the second component are press-connected to the printed circuit board.

EXAMPLE 10

The printed circuit board according to example 9, wherein the first component and the second component have been press-connected to the PCB using a press-in technique.

EXAMPLE 11

The printed circuit board according any combination of examples 9 and 10, wherein the first component and/or the second component comprise a recess in its bottom surface into which a protruding part of the overlapping second component and/or the first component, respectively, is inserted.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A printed circuit board, comprising:
a first component arranged at a first surface of the printed circuit board, wherein the first component comprises a bottom surface facing the first surface, and wherein the bottom surface of the first component comprises a recess;
a second component arranged at a second surface of the printed circuit board, wherein the second component comprises a pin inserted into the recess of the first component;
wherein the first component is in a laterally overlapping position with the second component; and
wherein the first component and the second component are press-connected to the printed circuit board.

2. The printed circuit board of claim 1, wherein the first component and the second component have been press-connected to the printed circuit board using a press-in technique.

3. The printed circuit board of claim 1, further comprising a through-hole, wherein the pin is inserted through the through-hole into the recess of the first component.

4. The printed circuit board of claim 3, wherein the pin comprises an expansion zone, wherein a diameter of the through-hole is greater than a width of the pin at a non-extended area, and wherein the diameter of the through-hole is smaller than the width of the pin at the expansion zone.

5. The printed circuit board of claim 3, wherein a diameter of the through-hole is greater than a width of a distal end of the pin but smaller than the width of a near end of the pin.

6. The printed circuit board of claim 1, wherein the first component comprises a spacer at the bottom surface of the first component facing the first surface of the printed circuit board.

7. The printed circuit board of claim 1, wherein the second component comprises a spacer at a bottom surface of the second component facing the second surface of the printed circuit board.

8. The printed circuit board of claim 1, wherein the pin is non-positively locked with the printed circuit board.

9. The printed circuit board of claim 1, wherein a distal end of the pin is slimmer than a near end of the pin.

10. The printed circuit board of claim 1, wherein a width of an opening of the recess at the bottom surface of the first component is greater than an inner diameter of the recess.

11. The printed circuit board of claim 1, wherein the recess is a first recess, wherein the pin is a second pin, wherein the second component further comprises a bottom surface facing the second surface, and wherein the bottom surface of the second component comprises a second recess, and wherein the first component comprises a first pin inserted into the second recess of the second component.

* * * * *